United States Patent [19]

Miller

[11] Patent Number: 5,712,882
[45] Date of Patent: Jan. 27, 1998

[54] SIGNAL DISTRIBUTION SYSTEM

[75] Inventor: Charles A. Miller, Fremont, Calif.

[73] Assignee: Credence Systems Corporation, Fremont, Calif.

[21] Appl. No.: 582,573

[22] Filed: Jan. 3, 1996

[51] Int. Cl.$^6$ ............................................. H04L 7/00
[52] U.S. Cl. ........................ 375/356; 371/1; 370/517; 327/153
[58] Field of Search ............................ 375/354, 356, 375/371, 373; 371/1; 370/516–518; 327/144, 152, 153, 161

[56] References Cited

U.S. PATENT DOCUMENTS

| | | |
|---|---|---|
| 3,496,477 | 2/1970 | Page. |
| 3,786,419 | 1/1974 | Nick ............................................. 375/356 |
| 4,229,816 | 10/1980 | Breidenstein et al. .............. 375/356 X |
| 4,447,870 | 5/1984 | Tague et al. ............................... 395/556 |
| 4,503,490 | 3/1985 | Thompson ........................... 375/356 X |
| 4,998,262 | 3/1991 | Wiggers. |
| 5,249,206 | 9/1993 | Appelbaum et al. .................. 375/356 |
| 5,293,626 | 3/1994 | Priest et al. ................................ 395/552 |
| 5,298,866 | 3/1994 | Kaplinsky ................................. 327/261 |
| 5,305,451 | 4/1994 | Chao et al. ................................ 395/555 |
| 5,361,277 | 11/1994 | Grover .................................... 375/356 |
| 5,369,640 | 11/1994 | Watson et al. ............................... 371/1 |
| 5,398,262 | 3/1995 | Ahuja ..................................... 375/356 |
| 5,432,823 | 7/1995 | Gasbarro et al. ..................... 370/517 X |

Primary Examiner—Young T. Tse
Attorney, Agent, or Firm—Smith-Hill and Bedell

[57] ABSTRACT

A clock signal distribution system provides a set of synchronized, spatially distributed local clock signals. The system includes a source of periodic reference clock signal, a set of spatially distributed deskewing circuits and first and second transmission lines. The first transmission line routes the reference clock signal from the source to the deskewing circuits in a first order of succession. The second transmission line routes the reference clock signal from the source to the deskewing circuits in a second order of succession that is reverse to the first order of succession. The two transmission lines are of similar length and velocity of signal propagation between adjacent deskewing circuits. Each deskewing circuit produces an output local clock signal having a phase that is midway between phases of the clock signal arriving at the deskewing circuit via the first and second transmission lines. The local output signals produced by the deskewing circuits all have the same phase and frequency despite varying distances of the deskewing circuits from the clock source.

4 Claims, 2 Drawing Sheets

SIGNAL DISTRIBUTION SYSTEM

BACKGROUND OF THE INVENTION

1. Field of the Invention

The present invention relates to a system for providing clock and data signals from a central source to spatially distributed modules of an electronic circuit.

2. Description of Related Art

In a digital system formed by a-set of interconnected operating modules, one of the signals distributed to each module is a clock signal for controlling the timing of data transfer operations between the modules. For example a computer may include several circuit boards or distributed processors mounted in a chassis and interconnected by backplane wiring to a module containing a central controller and a clock signal source. One of the conductors in the back-plane carries the clock signal to each of the other modules in the system. For proper operation of the circuit, clock signal pulses should arrive at the various modules at substantially the same time; otherwise reliable data transmission is not ensured. However, since the modules are at varying distances along the backplane from the clock signal source, the clock signal pulses do not arrive at each circuit board concurrently. Such clock signal skew is tolerable at lower clock signal frequencies where it is small compared to the period of the clock signal. But at higher clock frequencies where clock signal skew becomes a significant portion of the clock signal period, data transmission on the backplane becomes unreliable.

Signal skew can also be a problem in electronic instruments having distributed components that must operate together in a synchronous manner. For example, an integrated circuit (IC) tester may include a host unit and multiple operating modules spatially distributed but interconnected for communicating with the host unit. Each operating module may provide an interface to a separate pin of an IC under test. At various times, an operating module may transmit a test signal to an IC pin or may acquire output data produced by the IC at the pin. One of the functions of the host unit is to coordinate the actions of the operating modules. For example, to signal the start of a test the host unit may transmit a "start" signal to each operating module. The host unit may also transmit a global clock signal to each operating module to synchronize the actions of the operating modules during the test and to synchronize data transmission between the host and the modules during the test. If the clock and other control and data signals travel varying distances to reach the operating modules, they arrive at the various modules at different times. Such control and clock signal skew, if sufficiently large, can result in a timing mismatch between module operations and can adversely affect synchronous communications between the modules and the host unit.

U.S. Pat. No. 5,369,640 issued Nov. 29, 1994 to Watson et al, describes a system for reducing skew in a clock signal sent to remote operating modules by providing a separate transmission line from the clock signal source to each operating module and by adjusting the transmission lines so that they all have the same length. However this "star bus" solution to the signal skew problem can be somewhat unwieldy in systems having a large number of operating modules because so many transmission lines must emanate from the signal source.

Another method for eliminating clock signal skew is described in U.S. Pat. No. 4,447,870 issued May 8, 1984 to Tague et al. Here a delay circuit is provided on each operating module for delaying a clock signal arriving at each operating module. The delay circuit in each operating module is adjusted so that the sum of delays provided by the clock signal transmission line and the adjustable delay circuit is equal to a standard delay. This method allows the clock signal to be delivered to the operating modules through a single transmission line connected to all operating modules as in a backplane. However it requires a time-consuming and difficult process of manually calibrating the delay circuit in each operating module. Also, whenever an operating module is moved to a new position along the transmission line its clock delay circuit must be readjusted.

U.S. Pat. 5,361,277 issued Nov. 1, 1994 to Grover describes a system for delivering a phase synchronized clock signal to each of several distributed circuit modules. The system employs parallel "outgoing" and "return" transmission lines routed to each module. A clock source transmits an outgoing clock signal on the outgoing transmission line to each module in turn and then to a distant point beyond the last module where the outgoing and return transmission lines are tied together. The clock signal then returns from the distant point passing each module in reverse order via the return transmission line. A deskewing circuit at each module taps the transmission lines as they pass the module. The deskewing circuit monitors the phases of outgoing and returning clock signals and produces a local clock signal having a phase that is midway between the phases of the outgoing and returning clock signals. The local clock signals produced by all deskewing circuits are all in phase regardless of the variation in distance of the modules from the clock source. Grover describes relatively complicated circuits for producing a local clock signal having a phase midway between the outgoing and returning clock signals. These circuits rely on counters, oscillators, ramp generators and/or frequency dividing circuits that are difficult to implement, that are subject to jitter, that do not lend themselves to digital I.C. techniques, or that require substantial integrated circuit space when incorporated into IC's implementing the modules. Also the interval halving and phase lock techniques taught by Grover do not correct for local clock circuit layout path variations that contribute to phase error. In addition, when used for large distributed processor systems and complex integrated circuit designs, clock fan-out and distribution becomes a significant problem. In such systems the clock signal may have to be distributed to hundreds or thousands of modules. A single clock source capable of driving so many circuit modules is difficult to realize.

What is needed is a system for delivering synchronized clock and data signals to spatially distributed modules of a synchronous digital circuit module. The system should lend itself to digital integrated circuit fabrication techniques and should not require complicated circuitry at each module or circuit cluster. The system should also be relatively insensitive to noise or temperature variation and should minimize reference clock signal fan-out.

SUMMARY OF THE INVENTION

A clock and data signal distribution system provides a set of synchronized local clock signals to spatially distributed circuit modules. The system includes a source producing a periodic reference clock signal, a set of deskewing circuits and first and second transmission lines. Each deskewing circuit is located near a corresponding one of the circuit modules. The first transmission line routes the reference clock signal from the source to the deskewing circuits in a first order of succession. The second transmission line routes the reference clock signal from the source to the deskewing circuits in a second order of succession that is reverse to the first order of succession. The two transmission lines are of similar length and velocity of signal propagation between adjacent deskewing circuits. Each deskewing circuit produces an output local clock signal having a phase that is midway between phases of the clock signal arriving at the deskewing circuit via the first and second transmission lines. Each deskewing circuit provides its output local clock signal to its corresponding circuit module. The local output signals produced by the deskewing circuits all have the same phase and frequency despite varying distances of the deskewing circuits from the clock source.

To produce its local clock signal, each deskewing circuit passes the clock signal arriving first on one of the first and second transmission lines through identical first and second delay circuits in succession. Each deskewing circuit adjusts a delay of the delay circuits so that a reference clock signal produced at the output of the second delay circuit is phase locked to the clock signal arriving on the other transmission line. The local clock signal is produced at the output of the first delay circuit.

Each deskewing circuit also includes a third delay circuit having the same delay as the first and second delay circuits. Third and fourth transmission lines; similar to the first and second transmission lines, route data from a host module located near the clock source to the deskewing circuits. Each deskewing circuit passes the data to its corresponding local module. Data pulses originating at the host module will arrive concurrently at each local module.

It is accordingly an object of the invention to provide a set of synchronized local clock signals to spatially distributed circuit modules of the electronic circuit.

It is also an object of the invention to provide a system for delivering data signals concurrently from a data source to the set of spatially distributed circuit modules.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
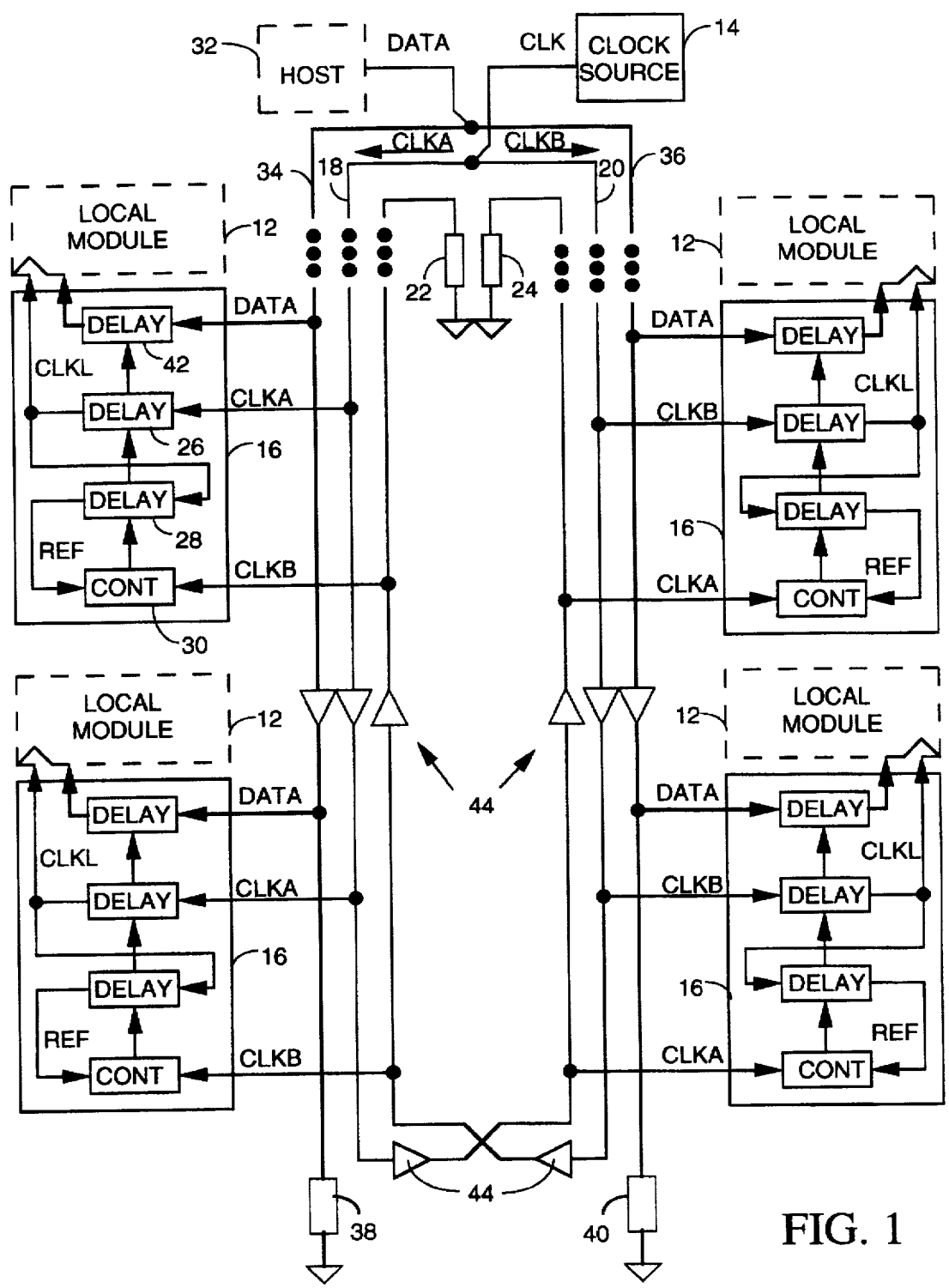
FIG. 1 is a block diagram depicting a clock signal distribution system in accordance with the present invention.

FIG. 1 depicts a system 10 in accordance with the present invention for providing synchronized local clock and data signals to a set of distributed local modules 12 of a logic circuit. System 10 includes a clock source 14 for generating a periodic clock signal CLK, a set of deskewing circuits 16, and a first and second transmission lines 18 and 20. Each deskewing circuit 16 is located near a corresponding local module 12 and generates a local clock signal CLKL for the corresponding local module 12. First transmission line 18 routes the clock signal CLK output of source 14 as a reference clock signal CLKA to each deskewing circuit 16 in succession (in "counter-clockwise" order as shown in FIG. 1) and then grounds CLKA through its characteristic impedance 22. Second transmission line 20 also routes the clock signal CLK output of source 14 as reference clock signal CLKB to each deskewing circuit 16 in succession and then grounds CLKB through its characteristic impedance 24. However second transmission line 20 routes reference signal CLKA to the deskewing circuits 16 in reverse ("clockwise") order to the routing order of reference signal CLKA provided by first transmission line 18. Although the first and second transmission lines transmit clock signals in opposite directions between adjacent deskewing circuits 16, they have the same length and velocity of signal propagation between the adjacent circuit modules. The period of the CLK signal is suitably longer than the time required for a CLKA or CLKB pulse to travel via transmission line 18 or 20 to the most remote deskewing circuit 16.

At each deskewing circuit 16 one of the incoming reference signals CLKA or CLKB leads the other in phase because the leading reference signal travels a shorter distance from source 14 to the deskewing circuit than the lagging reference signal. Each deskewing circuit 16 senses the phases of the incoming CLKA and CLKB reference signals and produces its local clock signal CLKL having a phase midway between phases of the leading and lagging reference signals. This ensures that all of the local clock signals have the same phase.

Each deskewing circuit 16 includes identical first and second adjustable delay circuits 26 and 28 and a phase lock loop controller 30. In each deskewing circuit 16 closer to clock source 14 via transmission line 18 than via line 20, the leading reference clock signal CLKA passes through the first delay circuit 26 to become the local clock signal CLKL delivered to the nearby local module 12. The local clock signal CLKL also passes through the second delay circuit 28 to become a local reference signal REF supplied to one input of controller 30. Delay circuits 26 and 28 are similar and have similar delays. The lagging reference clock signal CLKB drives a second input of controller 30. Controller 30 produces an output signal VPLL supplied to both delay circuits 26 and 28 to control their delays. When REF leads the CLKB, controller 30 decreases the magnitude of VPLL to increase the delays of delay circuits 26 and 28. When REF lags CLKB, controller 30 increases the magnitude of VPLL to decrease the delays of delay circuits 26 and 28. Thus the feedback provided by controller 30 adjusts the delays of delay circuits 26 and 28 to phase lock REF to its lagging reference clock signal input CLKB. When REF is phase locked to lagging reference signal CLKB, the local clock signal CLKL will have a phase that is midway between phases of CLKA and CLKB. Each deskewing circuit 16 closer to clock source 14 via transmission line 20 than via line 18 operates in a similar manner except that leading clock signal CLKB passes through the first delay circuit 26 to become the local clock signal CLKL and controller 30 adjusts the delays of delay circuits 26 and 28 to phase lock REF to lagging reference signal input CLKA.

Figure 2:
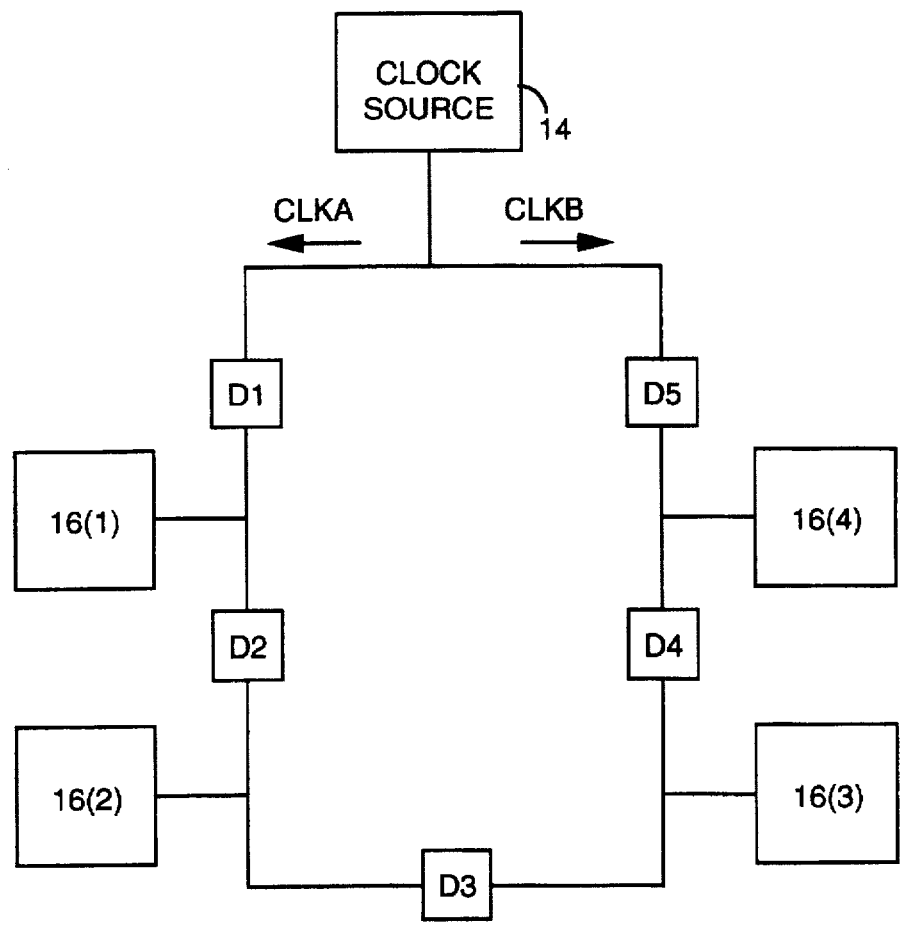
FIG. 2 is a diagram illustrating routing delays between the clock source and deskewing circuits of a system similar to that of FIG. 1 employing four deskewing circuits.

FIG. 2 is a diagram illustrating delays in an example system having four deskewing circuits 16(1)–16(4). The CLKA signal travels first from source 14 to deskewing circuit 16(1) through a delay D(1), the inherent delay of transmission line 18 between source 14 and deskewing circuit 16(1). The CLKA signal then travels to each deskewing circuit 16(2)–16(4) in succession through delays D(2)

−D(4), the inherent delays of transmission line 18 from each deskewing circuit to the next. The CLKB signal travels first from source 14 to deskewing circuit 16(5) through a delay D(5), the inherent delay of transmission line 20 between source 14 and deskewing circuit 16(4). The CLKB signal then travels in reverse succession to deskewing circuits 16(3)–16(1) through delays D(4)–D(2), the inherent delays of transmission line 20 between each deskewing circuit and the next. Since transmission lines 18 and 20 have the same length and velocity of signal propagation between adjacent deskewing circuits, delays D(2)–D(4) are the same regardless of the direction of signal travel.

At deskewing circuit 16(1) a pulse of the CLKA signal arrives from source 14 after a delay of D1 while the CLKB signal arrives from source 14 after a delay of D(2)+D(3)+ D(4)+D(5). Deskewing circuit 16(1) produces each local clock signal CLKL pulse at a time that is midway in time between arrivals of the CLKA and CLKB pulses. Thus the CLKL pulse produced by deskewing circuit 16(2) will be delayed from the CLKA pulse leaving source 14 by $$DELAY(1)=(\tfrac{1}{2})D(1)+(\tfrac{1}{2})[D(2)+D(3)+D(4)+D(5)].$$

At deskewing circuit 16(2) a pulse of the CLKA signal arrives from source 14 after a delay of D1+D2 while the CLKB signal arrives from source 14 after a delay of D(3) +D(4)+D(5). Since deskewing circuit 16(2) also produces each local clock signal CLKL pulse at a time that is midway in time between arrivals of the CLKA and CLKB pulses, the CLKL pulse produced by deskewing circuit 16(2) will be delayed from the CLKA pulse leaving source 14 by $$DELAY(2)=(\tfrac{1}{2})[D(1)+D(2)]+(\tfrac{1}{2})[D(3)+D(4)+D(5)].$$

By inspection of the above relations, we see that DELAY (1) and DELAY(2) have the same value. A similar analysis will show that each deskewing circuit 16(1)–16(4) produces an output local clock signal pulse that is delayed from the CLK output of source 14 by the same amount of time. Thus all local clock signals CLKL produced by deskewing circuits 16(1)–16(4) will have the same phase and frequency.

Referring again to FIG. 1, a host module 32 near clock source 14 transmits a DATA signal to deskewing circuits 16 via a pair of transmission lines 34 and 36. Transmission line 34 conveys the DATA signal to the deskewing circuits 16 that are closer to clock source 14 via transmission line 18 than line 20 wherein incoming reference signal CLKA leads incoming reference signal CLKB. Segments of transmission line 34 between source 14 and successive deskewing circuits 16 have the same length and velocity of signal propagation as corresponding segments of transmission line 18. Transmission line 34 terminates at its remote end through its characteristic impedance 38. Transmission line 36 conveys the DATA signal to the deskewing circuits 16 that are closer to clock source 14 via transmission line 20 than line 18 wherein incoming reference signal CLKB leads incoming reference signal CLKA. Segments of transmission line 34 between source 14 and successive deskewing circuits 16 have the same length and velocity of signal propagation as corresponding segments of transmission line 20. Transmission line 36 terminates at its remote end through its characteristic impedance 40.

Each deskewing circuit 16 includes a third delay circuit 42 that is identical to delay circuits 26 and 28, also controlled by the VPLL signal from controller 30. The third delay circuit 42 delays the incoming DATA signal by the same amount of time that delay circuit 26 delays the incoming reference signal CLKA or CLKB. Each deskewing circuit 16 delivers the delayed DATA signal to its corresponding local module 12. The third delay circuits 42 in deskewing circuits 16 ensure that a DATA signal pulse originating at host module 32 arrives at all local modules 12 at the same time. It should be understood that transmission lines 34 and 36 could be expanded into multiple line parallel buses conveying parallel data words. In such case, each deskewing circuit 16 would be provided with multiple delay circuits 42, each delaying a separate bit of the word on bus 34 or 36.

Matching sets of amplifiers 44 may optionally be inserted at adjacent points along transmission lines 18, 20, 34 and 36 to reduce attenuation in reference clock signal CLKA and CLKB when the transmission lines are long. The amplifiers also reduce the CLK signal fan out.

Figure 3:
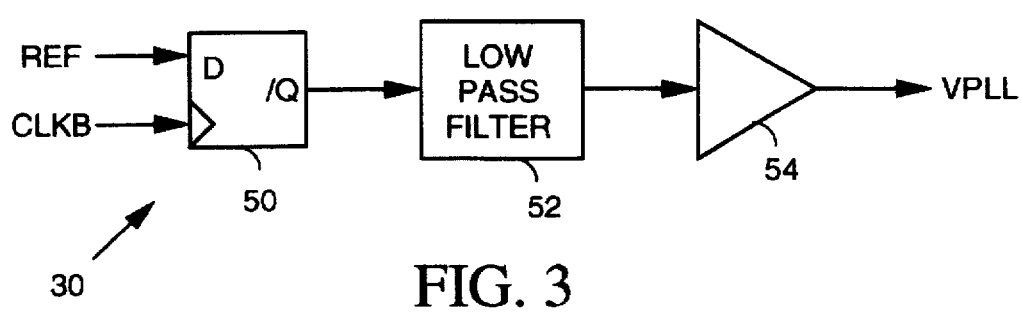
FIG. 3 is a block diagram illustrating the phase lock loop control circuit of FIG. 1 in more detail.

FIG. 3 is a block diagram illustrating the phase lock loop control circuit 30 of FIG. 1 in more detail. The lagging clock signal CLKB (or CLKA) drives the clock input of a type D flip-flop 50. The REF signal drives the flip-flop's D input. A low pass filter integrates the inverting Q output of flip-flop 50 and supplies the result to an input of an amplifier 54. Amplifier 54 produces the VPLL signal controlling the delay circuits 26, 30 and 42 of FIG. 1. When REF leads CLKB, the \Q output of flip-flop 50 goes low driving down VPLL output of amplifier 54. The falling VPLL increases the delay of delay circuits 26 and 28, thereby bringing REF closer into phase with CLKB. Conversely, when REF lags CLKB, the \Q output of flip-flop 50 goes high driving up VPLL output of amplifier 54. The rising VPLL decreases the delay of delay circuits 26 and 28, to bring REF closer into phase with CLKB. Thus in steady state operation, the feedback provided by control circuit 30 holds REF in phase with CLKB.

Figure 4:
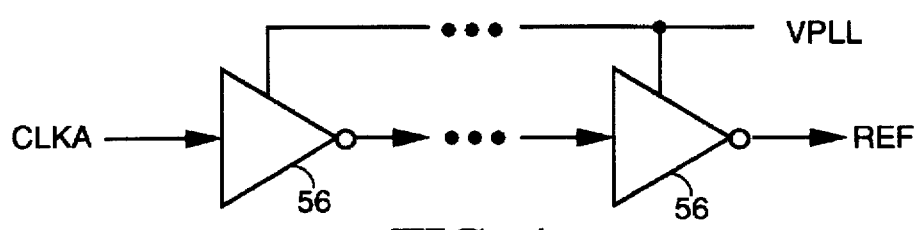
FIG. 4 illustrates a typical delay circuit of FIG. 1.

FIG. 4 illustrates a typical delay circuit 26 of FIG. 1. Delay circuits 28 and 42 are similar. Delay circuit 26 consists of a set of inverters 56 connected in series, the first inverter receiving the CLKA signal and the last inverter producing the REF signal. The VPLL signal from amplifier 54 supplies power to inverters 56. The magnitude of VPLL controls the switching speed of each inverter 56 and therefore controls the delay of delay circuit 26.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for generating a set of synchronized, spatially distributed local clock signals, the apparatus comprising:

a clock source for producing a periodic reference clock signal, a set of spatially distributed deskewing circuits;

a first transmission line for routing the reference clock signal from the clock source to the deskewing circuits in a first order of succession; and a second transmission line for routing the reference clock signal from the clock source to each deskewing circuit in a second order of succession that is reverse to the first order of succession, wherein each deskewing circuit includes local clock signal generator means for receiving the reference clock signal arriving via the first and second transmission lines and for producing in response thereto an output local clock signal having a phase that is midway between phases of the reference clock signal arriving via the first and second transmission lines, wherein said local clock signal generator means comprises:

a first delay circuit for receiving and delaying said reference clock signal arriving on another of said first and second transmission lines to produce one of said output local clock a second delay circuit for receiving and delaying said local clock signal to produce a local reference signal; and control means receiving the local reference signal and the reference clock signal arriving on another of said first and second transmission lines, for adjusting delays provided by said first and second delay circuits such that the local reference signal is phase locked to the reference clock signal arriving on said another of said first and second transmission lines.

2. The apparatus in accordance with claim 1 wherein segments of said first and second transmission lines routing the reference clock signals between any two of said deskewing circuits provide similar inherent signal transmission delays therebetween.

3. An apparatus for supplying a set of synchronized local clock signals to spatially distributed local modules of an electronic system and for delivering a data signal from a host module concurrently to the local modules, the apparatus comprising:

a clock source for producing a periodic reference clock signal, a set of spatially distributed deskewing circuits;

a first transmission line for routing the reference clock signal from the clock source to the deskewing circuits in accordance with a first order of succession;

a second transmission line for routing the reference clock signal from the clock source to each deskewing circuit in accordance with a second order of succession that is reverse to the first order of succession; and a third transmission line for routing the data signal to each of said deskewing circuits in said first order, wherein each deskewing circuit comprises:

a first delay circuit for receiving and delaying said reference clock signal arriving on said first transmission line to produce one of said set of synchronized local clock signals;

a second delay circuit for receiving and delaying said local clock signal to produce a local reference signal;

a third delay circuit for receiving and delaying said data signal conveyed on said third transmission line, thereby to produce an output delayed data signal; and control means receiving the local reference signal and receiving the reference clock signal arriving on said second transmission line, for adjusting delays provided by said first and second delay circuits to similar magnitudes such that the local reference signal is phase locked to the reference clock signal arriving on said second transmission line and for adjusting a delay provided by said third delay circuit to match the delay of said first delay circuit.

4. The apparatus in accordance with claim 3 wherein segments of said first, second and third transmission lines routing signals between any two of said deskewing circuits provide similar inherent signal transmission delays therebetween.

* * * * *

UNITED STATES PATENT AND TRADEMARK OFFICE
CERTIFICATE OF CORRECTION

PATENT NO. : 5,712,882
DATED : January 27, 1998
INVENTOR(S) : Charles A. Miller

It is certified that error appears in the above-identified patent and that said Letters Patent is hereby corrected as shown below:

Column 7, line 8 (Claim 1, line 24), "another" should be deleted and replaced with --one--, Column 7, line 10 (Claim 1, line 26), after "clock" should be inserted --signals;--.

Signed and Sealed this

Seventh Day of April, 1998

Attest:

BRUCE LEHMAN

*Attesting Officer*   *Commissioner of Patents and Trademarks*